US012769220B2

(12) United States Patent
Park et al.

(10) Patent No.: US 12,769,220 B2
(45) Date of Patent: Oct. 20, 2026

(54) METHOD FOR DETECTING COORDINATE OF MARK, COMPUTING SYSTEM FOR PERFORMING THE SAME, AND LITHOGRAPHY METHOD

(71) Applicant: Samsung Electronics Co., Ltd., Suwon-si (KR)

(72) Inventors: Seung Hak Park, Suwon-si (KR); Won Hyeok Jo, Suwon-si (KR); Woo-Yong Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 607 days.

(21) Appl. No.: 18/233,083

(22) Filed: Aug. 11, 2023

(65) Prior Publication Data

US 2024/0061354 A1 Feb. 22, 2024

(30) Foreign Application Priority Data

Aug. 18, 2022 (KR) ........................ 10-2022-0103279

(51) Int. Cl.

*G03F 9/00* (2006.01)
*G03F 7/00* (2006.01)
*G03F 7/039* (2006.01)

(52) U.S. Cl.

CPC ............ *G03F 9/7088* (2013.01); *G03F 7/039* (2013.01); *G03F 7/70625* (2013.01); *G03F 7/70683* (2013.01); *G03F 7/706849* (2023.05)

(58) Field of Classification Search

CPC .... G03F 9/7088; G03F 7/039; G03F 7/70625; G03F 7/70683; G03F 7/706849;

(Continued)

(56) References Cited

U.S. PATENT DOCUMENTS 6,819,426 B2 11/2004 Sezginer et al.
6,864,590 B2 3/2005 Bae et al.

(Continued)

FOREIGN PATENT DOCUMENTS

JP 7-111231 A 4/1995
JP 7-167614 A 7/1995
JP 2006-12867 A 1/2006

OTHER PUBLICATIONS

Office Action dated Feb. 19, 2026, issued by Korean Patent Office in Korean Patent Application No. 10-2022-0103279.

*Primary Examiner* — Stewart A Fraser
(74) *Attorney, Agent, or Firm* — Sughrue Mion, PLLC

(57) ABSTRACT

A method of detecting coordinates of a mark is provided. The method includes: providing a plurality of structures and the mark on a wafer, each of the plurality of structures including a plurality of mold insulating layers and a plurality of mold sacrificial layers, which are alternately stacked, an end of each of the plurality of structures including a portion having a stair shape, and the mark being between adjacent structures among the plurality of structures; forming a photoresist layer on the plurality of structures and the mark, the photoresist layer including a portion concave toward the wafer between the adjacent structures; detecting the coordinates of the mark by irradiating a beam to the mark; determining an offset of the coordinates of the mark based on a beam path changing factor; and correcting the coordinates of the mark based on the offset.

16 Claims, 18 Drawing Sheets

(58) Field of Classification Search
CPC .... G03F 9/7003; G03F 9/7019; G03F 9/7084; H10W 46/00
See application file for complete search history.

(56) References Cited

U.S. PATENT DOCUMENTS

| | | | | |
|---|---|---|---|---|
| 7,068,371 | B2 | 6/2006 | Goo | |
| 7,330,261 | B2 | 2/2008 | Van Haren et al. | |
| 8,705,007 | B2 | 4/2014 | Cramer et al. | |
| 11,300,888 | B2 | 4/2022 | Van Haren et al. | |
| 2004/0189964 | A1* | 9/2004 | Nijmeijer .............. | G03F 9/7026 355/55 |
| 2006/0092429 | A1* | 5/2006 | Hill .................... | G01B 9/02007 356/512 |
| 2007/0171392 | A1 | 7/2007 | Matsumoto | |
| 2009/0280418 | A1 | 11/2009 | Matsuda | |
| 2013/0258301 | A1* | 10/2013 | Dehe .................... | G01N 21/956 250/307 |

* cited by examiner

METHOD FOR DETECTING COORDINATE OF MARK, COMPUTING SYSTEM FOR PERFORMING THE SAME, AND LITHOGRAPHY METHOD

CROSS-REFERENCE TO RELATED APPLICATION

This application claims priority from Korean Patent Application No. 10-2022-0103279, filed on Aug. 18, 2022, in the Korean Intellectual Property Office, the disclosure of which is incorporated by reference herein in its entirety.

BACKGROUND

1. Field

The present disclosure relates to a method for detecting coordinates of a mark, a computing system for performing the same, and a lithography method.

2. Related Art

In a lithography process for manufacturing a semiconductor device and a liquid crystal display device, a lithography apparatus, which transfers a pattern formed on a mask or a reticle onto a substrate coated with a resist or the like, that is, a wafer, may be used.

When a precise semiconductor pattern is to be formed on the wafer through the lithography process described above, a position of the reticle should be in a designated position, and the wafer corresponding to the reticle should be also accurately aligned. To this end, it is important to accurately detect coordinates of the mark on the wafer.

SUMMARY

Aspects of the present disclosure provide a method of detecting coordinates of a mark through an offset determined based on a beam path changing factor.

Aspects of the present disclosure provide a computing system that detects coordinates of a mark through an offset determined based on a beam path changing factor.

Aspects of the present disclosure provide a method of performing a lithography process based on coordinates of a mark, which are detected through an offset determined based on a beam path changing factor.

The present disclosure is not limited to those aspects mentioned above, and additional objects of the present disclosure, which are not mentioned herein, will be clearly understood by those skilled in the art from the following description of the present disclosure.

According to an aspect of an embodiment, a method of detecting coordinates of a mark includes: providing a plurality of structures and the mark on a wafer, each of the plurality of structures including a plurality of mold insulating layers and a plurality of mold sacrificial layers, which are alternately stacked, an end of each of the plurality of structures including a portion having a stair shape, and the mark being between adjacent structures among the plurality of structures; forming a photoresist layer on the plurality of structures and the mark, the photoresist layer including a portion concave toward the wafer between the adjacent structures; detecting the coordinates of the mark by irradiating a beam to the mark; determining an offset of the coordinates of the mark based on a beam path changing factor; and correcting the coordinates of the mark based on the offset.

According to an aspect of an embodiment, a method of detecting coordinates of a mark, includes: providing a plurality of structures and a mark on a wafer; forming a photoresist layer on the plurality of structures and the mark, an upper surface of the photoresist layer including an inflection point between adjacent structures among the plurality of structures; determining the coordinates of the mark by irradiating a beam to the mark; determining an offset of the coordinates of the mark based on a beam path changing factor; and correcting the coordinates of the mark based on the offset.

According to an aspect of an embodiment, a computing system includes: a memory in which a program is stored; and at least one processor configured to execute the program to generate an offset function of coordinates of a mark provided on a wafer according to a beam path changing factor. The mark is disposed between structures, which are adjacent to each other, on the wafer and is covered by a photoresist layer, the photoresist layer includes a portion concave toward the wafer, and the beam path changing factor indicates characteristics of the wafer that affect a path of a beam when the beam is irradiated to the mark covered by the photoresist layer.

According to an aspect of an embodiment, a lithography method includes: providing, on a wafer, a plurality of structures, a mark, and a photoresist layer on the plurality of structures and the mark; providing coordinates of the mark to a lithography apparatus; and exposing the photoresist layer by using the lithography apparatus. An upper surface of the photoresist layer includes an inflection point between structures, among the plurality of structures, adjacent to each other, the coordinates of the mark are offset from initial coordinates, and the offset is determined based on a beam path changing factor that indicates characteristics of the wafer that affect a path of a beam irradiated to the mark.

BRIEF DESCRIPTION OF DRAWINGS

The above and other aspects and features will be more apparent from the following description of embodiments, taken in conjunction with the attached drawings, in which.

DETAILED DESCRIPTION

Embodiments will be described more fully with reference to the accompanying drawings, in which example embodiments are shown. Embodiments described herein are provided as examples, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
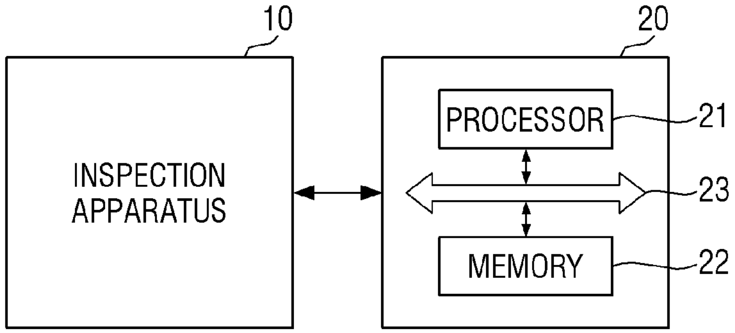
FIG. 1 is a view illustrating a mark inspection system according to some embodiments.

FIG. 1 is a view illustrating a mark inspection system according to some embodiments.

Referring to FIG. 1, the mark inspection system according to some embodiments may include an inspection apparatus 10 and a computing system 20.

Figure 2:
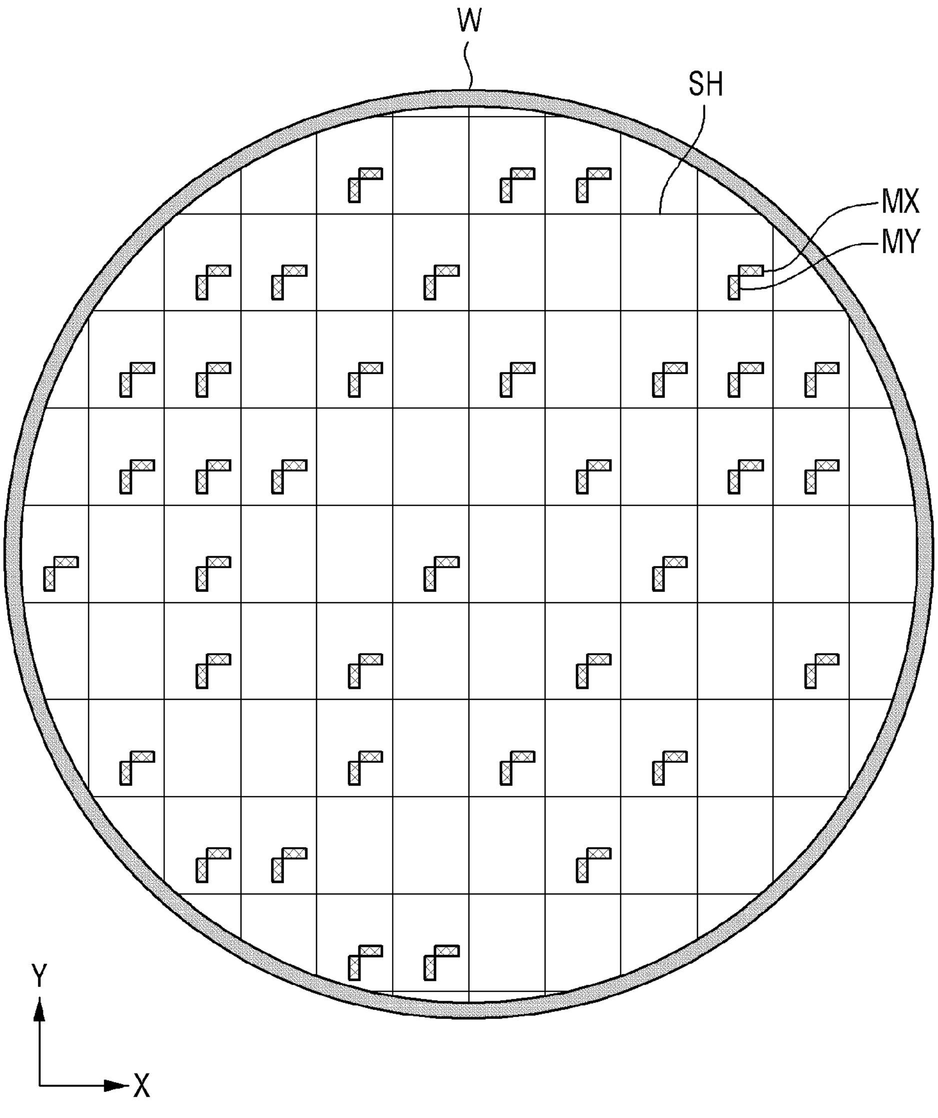
FIG. 2 is a view illustrating a wafer according to some embodiments.

The inspection apparatus 10 may detect coordinates of a mark (MX and MY of FIG. 2) on a wafer (W of FIG. 2). The computing system 20 may receive the coordinates of the mark, which are detected by the inspection apparatus 10, and may correct the coordinates of the mark.

The computing system 20 may include hardware components, including a processor 21, a memory 22, and a bus 23. The processor 21 and the memory 22 may exchange data through the bus 23.

The computing system 20 may include at least one processor 21. The processor 21 may be referred to as a processing unit, and may include, for example, at least one core capable of executing any command set (e.g., Lk-32 (Intel Architecture-32), 64-bit extension IA-32, x86-64, PowerPC, Sparc, MIPS, ARM, Lk-64 etc.) like a microprocessor, an application processor (AP), a digital signal processor (DSP), and a graphic processing unit (GPU). For example, the processor 21 may access the memory 22 via the bus 23 and execute commands stored in the memory 22.

The memory 22 may store a program for correcting coordinates of a mark according to some embodiments, and the processor 21 may execute the program. The processor 21 may correct the coordinates of the mark by executing the program stored in the memory 22. The processor 21 may store coordinates of the corrected mark in the memory 22.

In the mark inspection system according to some embodiments, the coordinates of the corrected mark may be provided to other devices. The coordinates of the corrected mark may be provided, for example, to a lithography apparatus.

In the mark inspection system according to some embodiments, the coordinates of the mark, which are corrected by the processor 21, may be transferred to the inspection apparatus 10. In addition, the inspection apparatus 10 may detect again whether the corrected coordinates of the mark, which are received by the computing system 20, are appropriate, and the processor 21 may correct the coordinates of the mark again based on the detected result. The processor 21 may store the corrected coordinates of the mark in the memory 22 again.

Figure 3:
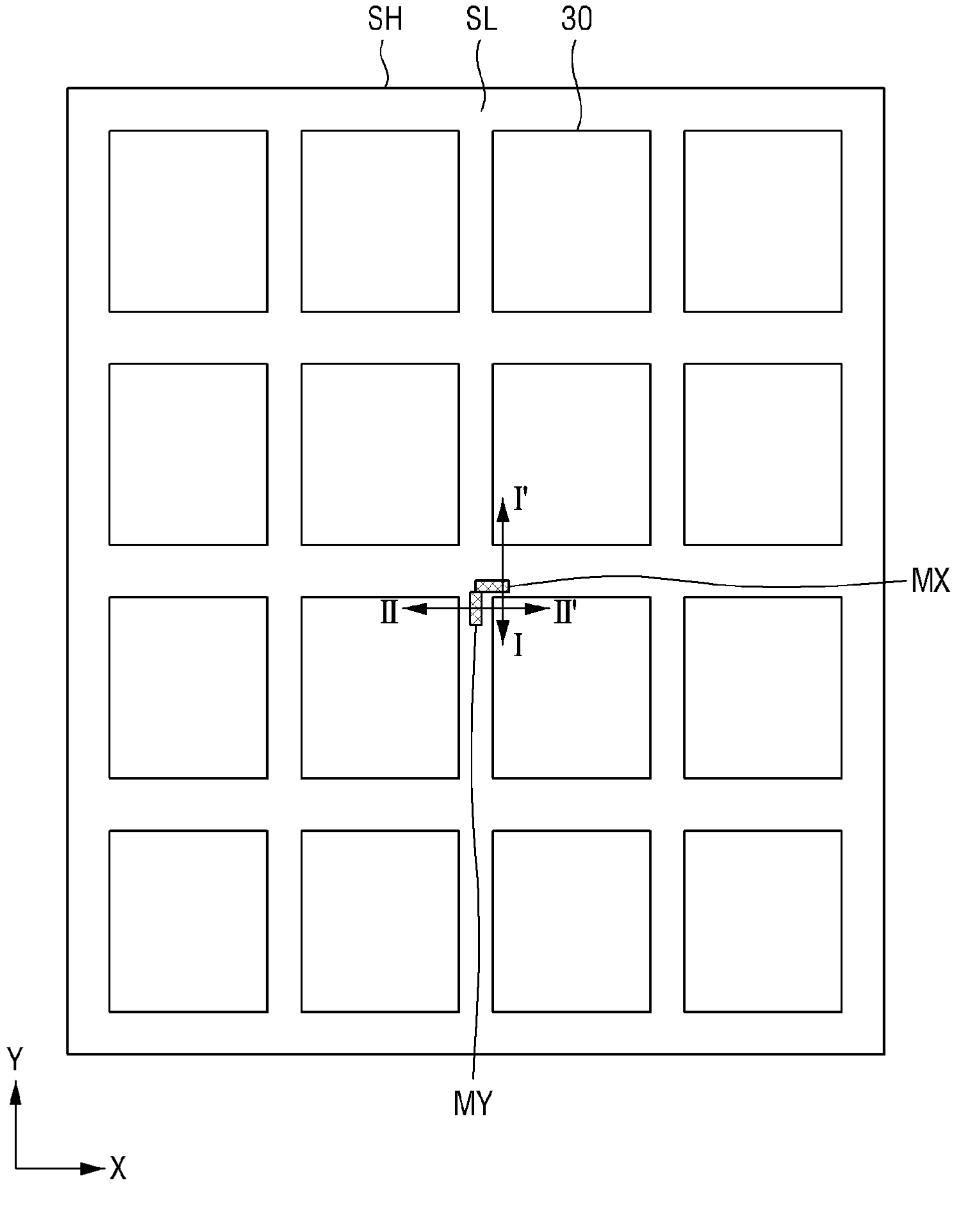
FIG. 3 is a view illustrating a shot region of a wafer according to some embodiments.

FIG. 2 is a view illustrating a wafer according to some embodiments. FIG. 3 is a view illustrating a shot region of FIG. 2.

Referring to FIGS. 2 and 3, the wafer W may include a plurality of shot regions SH. The shot region SH may be a region that is exposed by an exposure process of one time. The shot region SH may include one structure 30 or a plurality of structures 30.

The structure 30 may include, for example, a memory device, such as a non-volatile memory device. The structure 30 may include, for example, any one or any combination of a nonvolatile NAND-type flash memory, a phase-change random-access memory (PRAM), a magnetoresistive RAM (MRAM), a resistive RAM (ReRAM), a ferroelectric RAM (FRAM), and a NOR flash memory. Also, the structure 30 may include a volatile memory device, in which data is lost when a power source is cut off, such as a dynamic RAM (DRAM) and a static RAM (SRAM).

A scribe lane SL may be disposed between the plurality of structures 30. The scribe lane SL may define the structures 30. The scribe lane SL may extend between the structures 30 to separate the structures 30 from each other. The scribe lane SL may be a separation line for separating the structures 30 from each other in a sawing process.

At least one of the shot regions SH may include marks MX and MY. The marks MX and MY may be disposed on the scribe lane SL. For example, the marks MX and MY may be disposed to be adjacent to a central portion of the shot region SH, but are not limited thereto.

The marks MX and MY may be patterns used to accurately set an exposure region in a lithography process. The marks MX and MY may include a first mark MX and a second mark MY. For example, the first mark MX and the second mark MY may be disposed in the scribe lane SL in pairs. The first mark MX and the second mark MY may be disposed to be adjacent to each other, for example. For example, one shot region SH may include one first mark MX and one second mark MY, but is not limited thereto. One shot region SH may include a plurality of pairs of first and second marks MX and MY.

The first mark MX may be disposed between the adjacent structures 30 in a second direction Y of the plurality of structures 30. The second mark MY may be disposed between the structures 30, which are adjacent to each other in a first direction X, among the plurality of structures 30. For example, the first mark MX may have a bar shape extended in the first direction X, and the second mark MY may have a bar shape extended in the second direction Y.

Figure 4:
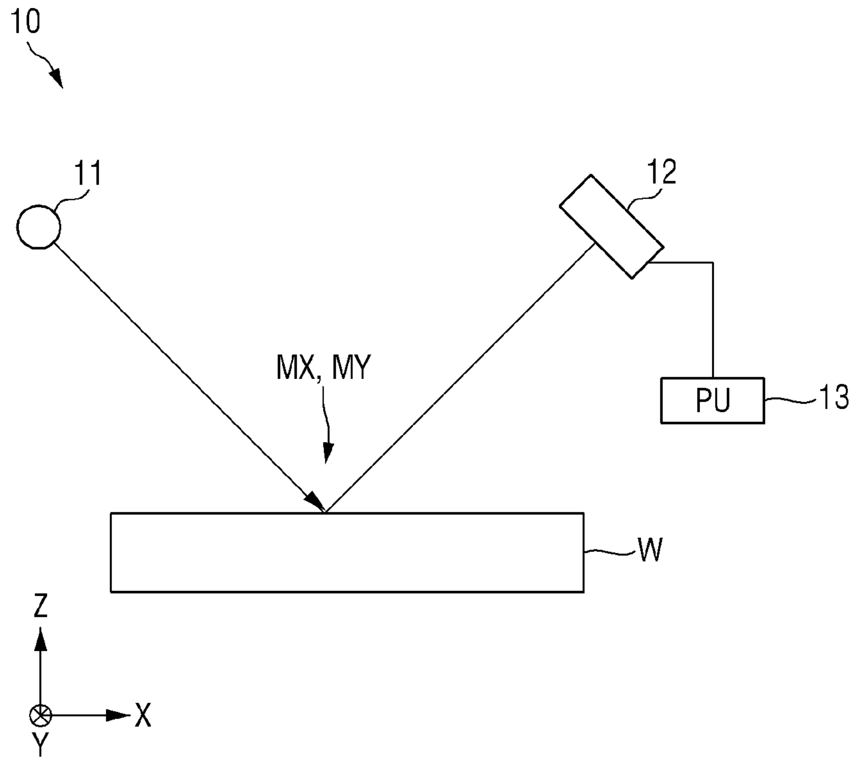
FIG. 4 is a view illustrating an inspection apparatus according to some embodiments.

FIG. 4 is a view illustrating the inspection apparatus of FIG. 1.

Referring to FIGS. 3 and 4, the inspection apparatus 10 may include hardware components, including a light source 11, a detector 12, and a processing unit (PU). The inspection apparatus 10 may detect coordinates of marks MX and MY on the wafer W.

The light source 11 may irradiate a laser beam onto the wafer W. The light source 11 may irradiate a laser beam to the marks MX and MY. The light source 11 may irradiate, for example, a beam having a single wavelength. The light source 11 may irradiate, for example, a beam having a wavelength of 534 nm, 633 nm, 780 nm or 850 nm. Alternatively, the light source 11 may irradiate a plurality of beams having different wavelengths.

The detector 12 may detect diffractive light diffracted from the marks MX and MY. The detector 12 may detect information of the diffractive light diffracted for each wavelength and/or the order after entering the marks MX and MY.

The processing unit 13 may detect the coordinates of the marks MX and MY by using the information of the diffractive light, which is detected by the detector 12. The processing unit 13 may detect intensity of a signal of the diffractive light detected by the detector 12.

In some embodiments, the processing unit 13 may be a separate element from the computing system 20 of FIG. 1. In some embodiments, the processing unit 13 may be included as a portion of the processor 21 of the computing system 20.

Figure 5:
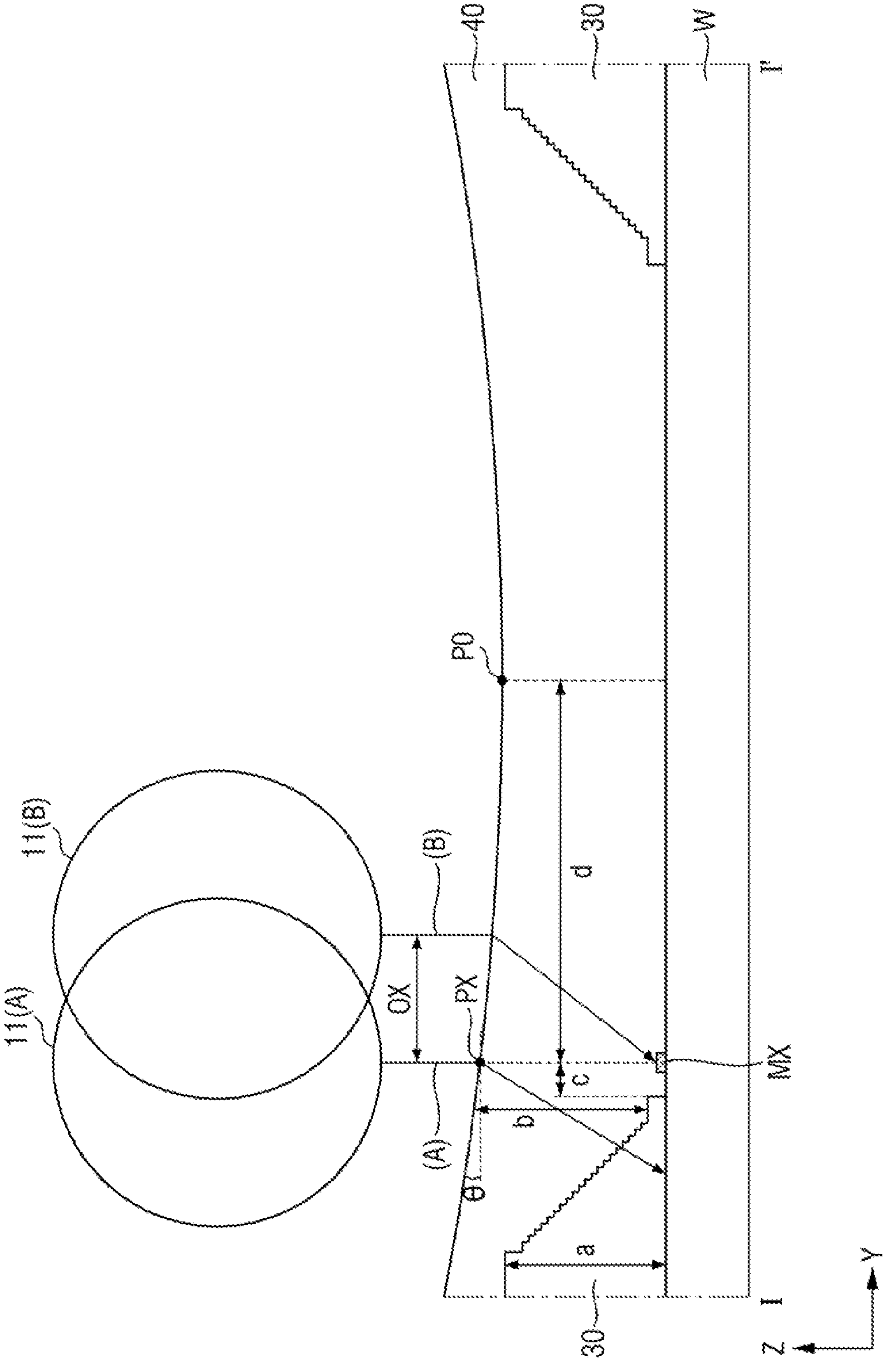
FIG. 5 is a cross-sectional view taken along line I-I of FIG. 3 according to some embodiments.
Figure 6:
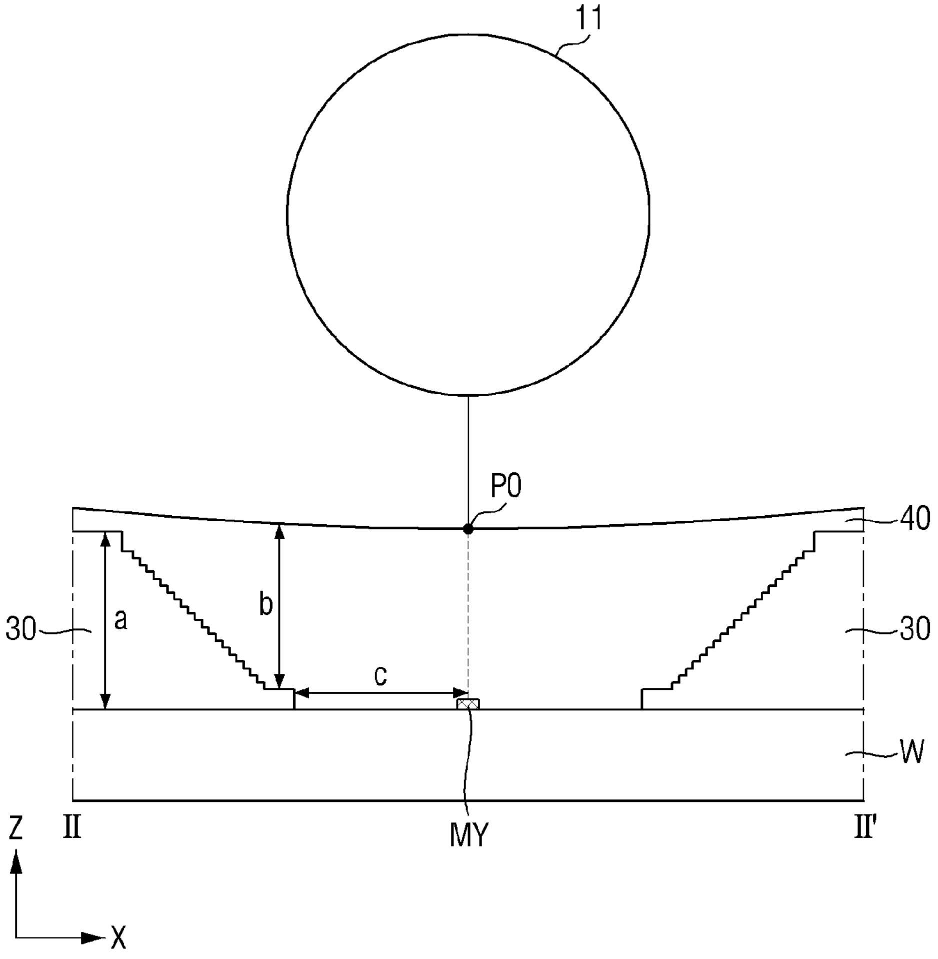
FIG. 6 is a cross-sectional view taken along line II-II of FIG. 3 according to some embodiments.
Figure 7:
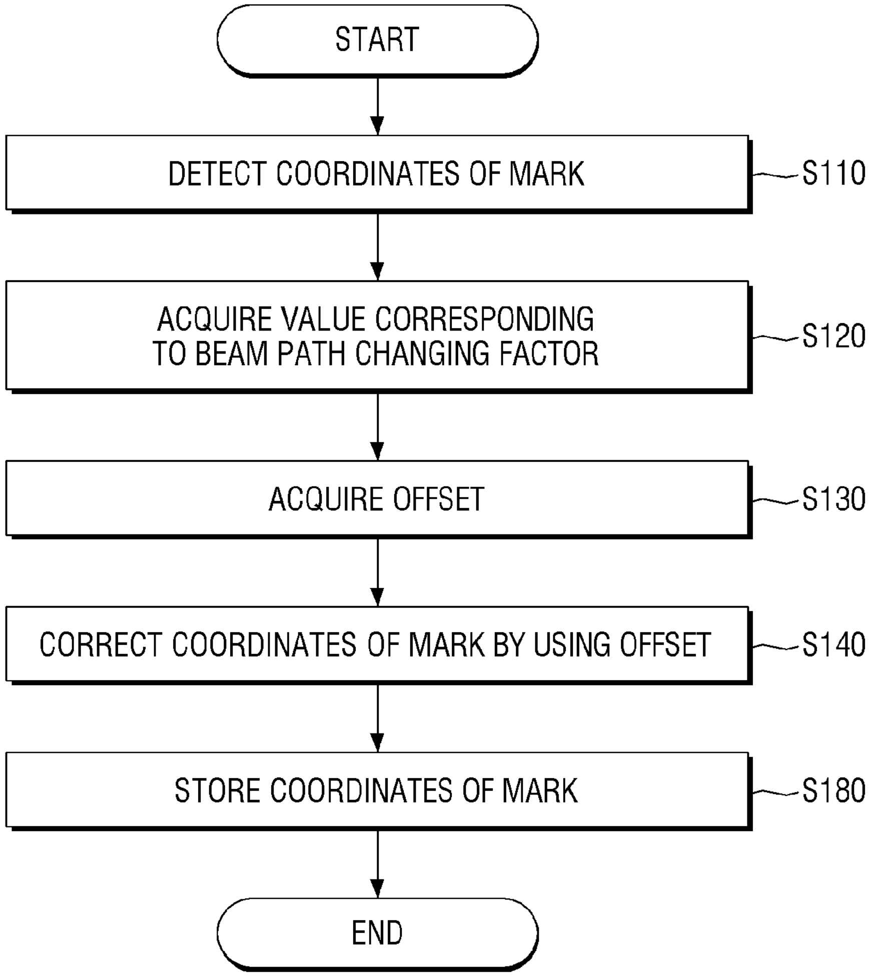
FIG. 7 is a flow chart illustrating a method of correcting coordinates of a mark according to some embodiments.

FIG. 5 is a cross-sectional view taken along line I-I' of FIG. 3. FIG. 6 is a cross-sectional view taken along line II-IF of FIG. 3. FIG. 7 is a flow chart illustrating a method of correcting coordinates of a mark according to some embodiments.

Referring to FIGS. 5 and 6, the structure 30, the first mark MX, the second mark MY, and a photoresist layer 40 may be disposed on the wafer W.

In some embodiments, the structure 30 may include a portion having a stair shape. An end of the structure 30 may include a portion having a stair shape. For example, each of both ends of the structure 30 in the first direction X and both ends of the structure 30 in the second direction Y may include a portion having a stair shape.

The photoresist layer 40 may cover the structure 30, the first mark MX and the second mark MY. The photoresist layer 40 may be formed on the wafer W, in which the structure 30, the first mark MX and the second mark MY are formed, by a spin coating process. The photoresist layer 40 may include an organic polymer coated from a solution. The wafer W to which the photoresist of a solution state is provided may be rotated at a high speed. As a residual resist bounces due to the spin rotation of the wafer W and a solvent is evaporated, the photoresist layer 40 of a solid state may be formed.

In this case, an upper surface of the photoresist layer 40 may not be flat due to a height of the structure 30, a shape of the structure 30, or a thickness of the photoresist layer 40. The upper surface of the photoresist layer 40 may be curved. The upper surface of the photoresist layer 40 may have an inclination. A height from the wafer W to the upper surface of the photoresist layer 40 in a third direction Z may not be constant toward the first direction X or the second direction Y. The height from the wafer W to the upper surface of the photoresist layer 40 in the third direction Z may be reduced and then increased toward the first direction X or the second direction Y. The photoresist layer 40 may include a portion that is concave toward the wafer W. The upper surface of the photoresist layer 40 may include an inflection point. For example, the photoresist layer 40 may include a portion that is concave toward the wafer W between the structures 30 adjacent to each other. Therefore, the concave portion of the photoresist layer 40 may change a path of a beam incident on the first mark MX or the second mark MY from the light source 11.

The beam irradiated to the marks MX and MY may be diffracted due to the marks MX and MY and the like. The coordinates of the marks MX and MY may be detected using diffractive light. The coordinates of the marks MX and MY may be detected by, for example, a coarse wafer alignment (COWA) operation of quickly capturing the marks MX and MY in a relatively wide range by using primary diffractive light, and a fine wafer alignment (FIWA) operation of detecting the coordinates of the marks MX and MY more accurately by using diffractive light having an optimal wavelength and an optimal order. In this case, the primary diffractive light used in the COWA operation may be particularly sensitive to the shape of the photoresist layer 40 having a concave portion. Therefore, an error may occur in the coordinates of the marks MX and MY, which are detected using the diffractive light.

However, the method of correcting the coordinates of the marks according to some embodiments may correct the coordinates of the marks MX and MY in consideration of a factor for changing the path of the beam irradiated to the marks MX and MY. For example, the factor may indicate characteristics of the wafer that affect the path of the beam. Therefore, the error of the coordinates of the marks MX and MY, which are detected using the diffractive light, may be reduced. Hereinafter, the method of correcting the coordinates of the marks MX and MY will be described in detail using the first mark MX as an example.

Referring to FIGS. 1, 4, 5 and 7, the inspection apparatus 10 may detect the coordinates of the first mark MX (S110).

The first mark MX may be disposed between the structures 30 adjacent to each other in the first direction X. A light source 11(A) may irradiate a beam A to the wafer W. The detector 12 may detect diffractive light diffracted by the wafer W, and the processing unit 13 may detect the coordinates of the first mark MX by using the diffractive light. However, due to the shape of the upper surface of the photoresist layer 40, the beam A may be irradiated to a position offset from the first mark MX, and intensity of the diffractive light may be reduced.

The computing system 20 may acquire a value corresponding to a beam path changing factor (S120).

The computing system 20 may receive data, such as a recipe of a previous process, and acquire the value corresponding to the beam path changing factor based on the received data. Alternatively, the computing system 20 may receive the value corresponding to a beam path changing factor from the outside.

The beam path changing factor may be an element that changes the path of the beam A irradiated to the first mark MX. In some embodiments, the beam path changing factor may include a height 'a' of the structure 30 in the third direction Z, a first thickness 'b' of the photoresist layer 40 in the third direction Z, a first distance 'c' in the first direction X between a center point of the first mark MX and the structure 30, a second distance 'd' in the first direction X between a virtual line(e.g., extension line) extended in the third direction Z from an inflection point P0 of the photoresist layer 40 and the center point of the first mark MX, and a slope 0 of the upper surface of the photoresist layer 40 at a point PX at which the upper surface of the photoresist layer 40 meets the virtual line extended in the third direction Z from the center point of the first mark MX. A height 'a' of the structure 30 in the third direction Z may indicate a maximum height of the structure 30 in the third direction Z. The thickness 'b' of the photoresist layer 40 in the third direction Z may indicate a maximum thickness of the photoresist layer 40 in the third direction Z. The center point of the first mark MX may indicate a center point in the first direction X. The inflection point P0 of the photoresist layer 40 may be a point of the upper surface of the photoresist layer 40, which is closest to the wafer W in the third direction Z.

In some embodiments, the beam path changing factor may further include a material of the photoresist layer 40. The beam path changing factor may further include a refractive index and a dielectric constant of the photoresist layer 40.

In some embodiments, the beam path changing factor may further include whether the beam irradiated to the marks MX and MY is a single beam or includes a plurality of beams, or may further include a wavelength of the beam irradiated to the marks MX and MY.

The computing system 20 may acquire a first offset OX of the coordinates of the first mark MX by using the value corresponding to the beam path changing factor and an offset function (S130).

The processor 21 may output the first offset OX of the coordinates of the first mark MX by using the value corresponding to the beam path changing factor and the offset function stored in the memory 22. The offset function may be a function having the beam path changing factor as an input variable and the first offset OX of the coordinates of the mark in the first direction X as an output variable. The processor 21 may receive a value corresponding to each of the height 'a', the first thickness '11', the first distance 'c', the second distance 'd' and the slope 0, and may output the first offset OX of the coordinates of the first mark MX by using the offset function.

The computing system 20 may correct the coordinates of the first mark MX by using the first offset OX (S140).

The first offset OX may be an offset of coordinates of the first mark MX in the second direction Y. The first offset OX may be an offset in the second direction Y between the light source 11(A) and a light source 11(B). The light source 11(B) may irradiate a beam B to a center point of the first mark MX in the second direction Y. For example, the processor 21 may correct the coordinates of the first mark MX by adding the first offset OX to the coordinates of the first mark MX in the second direction Y. The same coordinates may be given in the first direction X of the first mark MX. The computing system 20 may store the corrected coordinates of the first mark MX (S180). The processor 21 may store the corrected coordinates of the first mark MX in the memory 22.

Referring to FIGS. 1, 4, 6 and 7, the coordinates of the second mark MY may be corrected using the operations S110 to S180 described above. That is, correction may be performed for each of the coordinates of the first mark MX and the coordinates of the second mark MY.

The inspection apparatus 10 may detect the coordinates of the second mark MY (S110). The computing system 20 may acquire the value corresponding to the beam path changing factor (S120).

The computing system 20 may acquire a second offset of the coordinates of the second mark MY by using the value corresponding to the beam path changing factor and the offset function (S130). The second offset may be an offset of the coordinates of the second mark MY in the first direction X. The computing system 20 may correct the coordinates of the second mark MY by using the second offset. For example, the processor 21 may correct the coordinates of the second mark MY by adding the second offset to the coordinates of the second mark MY in the first direction X. The same coordinates may be given in the second direction Y of the second mark MY.

In the method of correcting the coordinates of the mark according to some embodiments, the offset function for outputting the offset of the coordinates of the first mark MX may be the same as the offset function for outputting the offset of the coordinates of the second mark MY.

The computing system 20 may store the corrected coordinates of the second mark MY in the memory 22 (S180).

Referring to FIG. 6, the second mark MY may be disposed between the structures 30 adjacent to each other in the second direction Y. For example, the slope 0 of the photoresist layer 40 may be 0 at a point P0 where the upper surface of the photoresist layer 40 meets a virtual line(e.g., extension line) extended in the third direction Z from a center point of the second mark MY. The point P0 where the upper surface of the photoresist layer 40 meets the virtual line extended in the third direction Z from the center point of the second mark MY may be the inflection point of the photoresist layer 40. The center point of the second mark MY may indicate a center point in the second direction Y. For example, a distance between the structure 30 disposed on one side of the second mark MY and the second mark MY may be the same as a distance between the structure 30 disposed on the other side of the second mark MY and the second mark MY.

Therefore, the path of the beam irradiated from the light source 11 to the second mark MY may not be changed due to the shape of the photoresist layer 40 on the second mark MY. In this case, the second offset may be 0.

Figure 8:
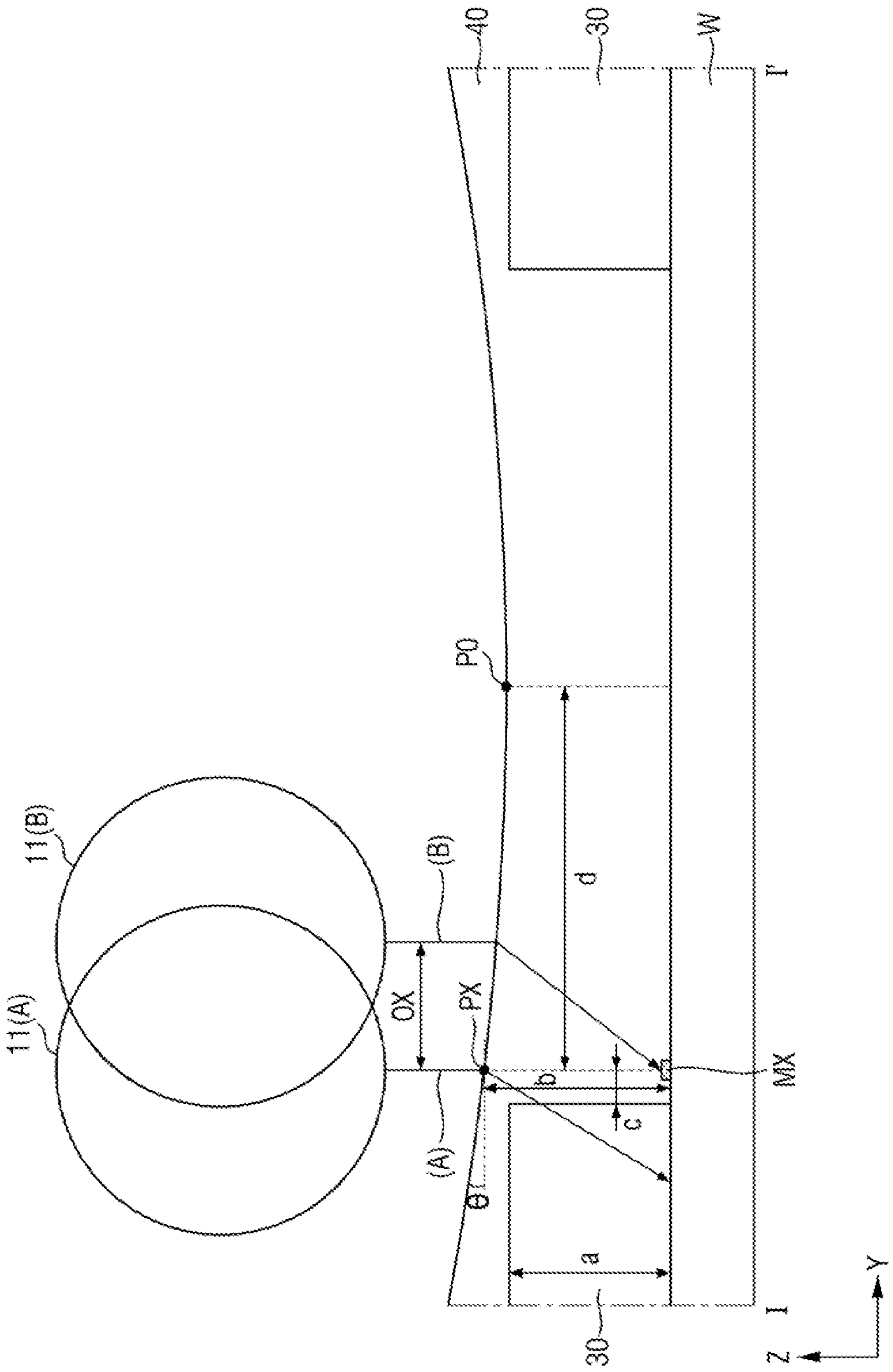
FIG. 8 is a view illustrating a method of correcting coordinates of a mark according to some embodiments.

FIG. 8 is a view illustrating a method of correcting coordinates of a mark according to some embodiments. For reference, FIG. 8 is a cross-sectional view taken along line I-I' of FIG. 3. For convenience of description, the following description will be based on differences from that made with reference to FIGS. 1 to 7.

In the method of correcting coordinates of a mark according to some embodiments in FIG. 8, the shape of the structure 30 may be diversified. In some embodiments, the structure 30 may not include a stair shape. For example, the end of structure 30 may be flat. Due to the height of the structure 30 or the thickness of the photoresist layer 40, the photoresist layer 40 may include a portion that is concave toward the wafer W. The upper surface of the photoresist layer 40 may include an inflection point.

Figure 9:
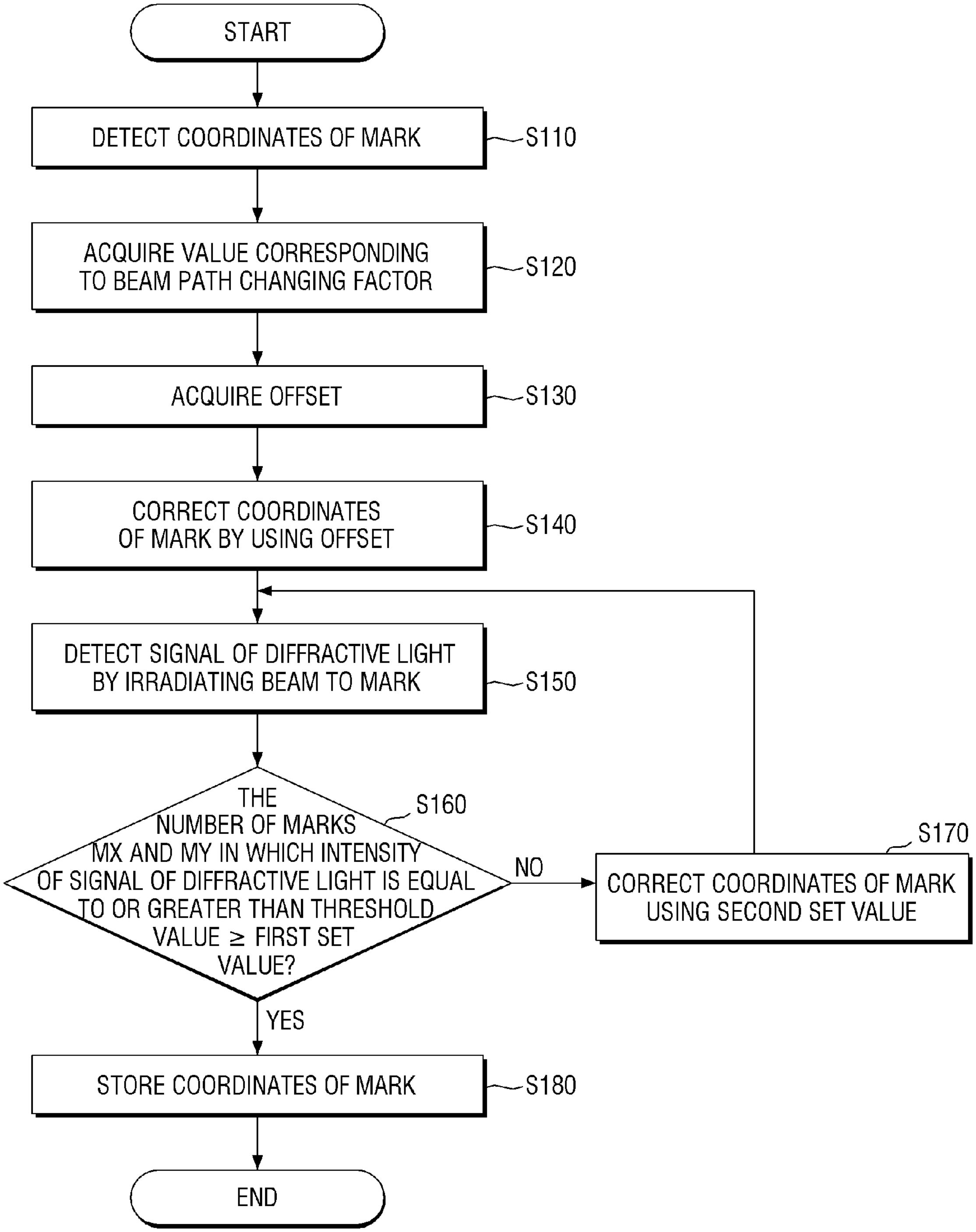
FIG. 9 is a view illustrating a method of correcting coordinates of a mark according to some embodiments.

FIG. 9 is a view illustrating a method of correcting coordinates of a mark according to some embodiments.

Referring to FIG. 9, the wafer W may include a plurality of first marks MX and a plurality of second marks MY. Using the operations S110 to S140 described above, correction may be performed for the coordinates of each of the first marks MX and the second marks MY. Using the operations S110 to S140 described above, correction may be performed for all of the coordinates of the first marks MX and all of the coordinates of the second marks MY, which are included in the wafer W.

Subsequently, the inspection apparatus 10 may irradiate a beam to the marks MX and MY and detect a signal of diffractive light by using the corrected coordinates of the marks MX and MY (S150). The inspection apparatus 10 may irradiate the beam to each first mark MX and detect the signal of the diffractive light by using the corrected coordinates of each of the first marks MX. The inspection apparatus 10 may irradiate the beam to each second mark MY and detect the signal of the diffractive light by using the corrected coordinates of each of the second marks MY.

The computing system 20 may determine the number of marks MX and MY in which the intensity of the signal of the diffractive light is equal to or greater than a threshold value, and determine whether the number is equal to or greater than a first set value (S160). The processor 21 may determine whether the number of the first marks MX in which the intensity of the signal of the diffractive light is equal to or greater than the threshold value is equal to or greater than the first set value, and the number of second marks MY in which the intensity of the signal of the diffractive light is equal to or greater than the threshold value is equal to or greater than the first set value.

The computing system 20 may correct the coordinates of the marks MX and MY by using a second set value when the number of marks MX and MY, in which the intensity of the signal of the diffractive light is greater than or equal to the threshold value, is less than or equal to the first set value (S170). The processor 21 may correct the coordinates of the first mark MX and the coordinates of the second mark MY by using the second set value when the number of the first marks MX, in which the intensity of the signal of the diffractive light is equal to or greater than the threshold value, is equal to or less than the first set value and the number of the second marks MY, in which the intensity of the signal of the diffractive light is equal to or greater than the threshold value, is equal to or less than the first set value. The processor 21 may correct the coordinates of the first mark MX by using the second set value when the number of the first marks MX, in which the intensity of the signal of the diffractive light is equal to or greater than the threshold value, is equal to or less than the first set value and the number of the second marks MY, in which the intensity of the signal of the diffractive light signal is equal to or greater than the threshold value, exceeds the first set value. The processor 21 may correct the coordinates of the second mark MY by using the second set value when the number of the first marks MX, in which the intensity of the signal of the diffractive light is equal to or greater than the threshold value, exceeds the first set value and the number of the second marks MY, in which the intensity of the signal of the diffractive light is equal to or less than the threshold value, is less than the first set value.

For example, the processor 21 may correct the coordinates of the first mark MX in the second direction Y by adding the second set value to the coordinates of the first mark MX in the second direction Y. The same coordinates may be given in the first direction X of the first mark MX. The processor 21 may correct the coordinates of the second mark MY in the first direction X by adding the second set value to the coordinates of the second mark MY in the first direction X. The same coordinates may be given in the second direction Y of the second mark MY.

Alternatively, the processor 21 may correct the coordinates of the first mark MX and the coordinates of the second mark MY by using different set values.

The threshold value, the first set value, and the second set value may be, for example, values preset and stored in the memory 22. For another example, the computing system 20 may receive the threshold value, the first set value, and the second set value from the outside.

Subsequently, the method may return to the operation S150.

When the intensity of the signal of the diffractive light is equal to or greater than the threshold value (S160), the computing system 20 may store the corrected coordinates of the marks MX and MY (S180). The processor 21 may store the corrected coordinates of the first mark MX and the corrected coordinates of the second mark MY in the memory 22 when the number of first marks MX in which the intensity of the signal of the diffractive light is greater than or equal to the threshold value is equal to or greater than the first set value and the number of second marks MY in which the intensity of the signal of the diffractive light is greater than or equal to the threshold value is equal to or greater than the first set value.

Figure 10:
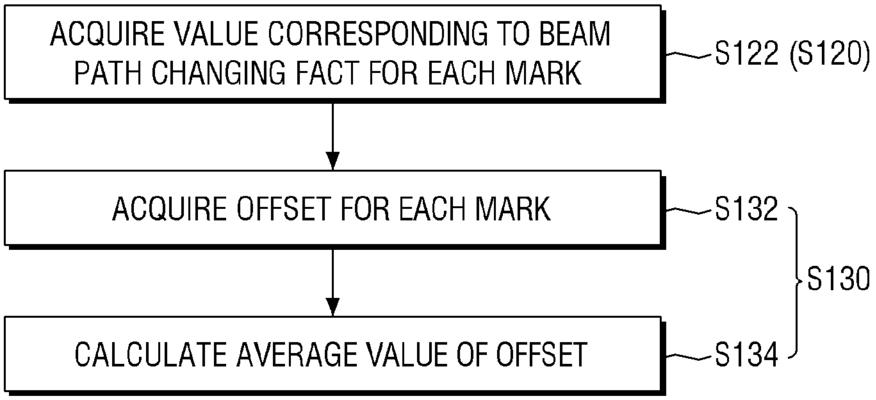
FIG. 10 is a flow chart illustrating a method of correcting coordinates of a mark according to some embodiments.

FIG. 10 is a flow chart illustrating a method of correcting coordinates of a mark according to some embodiments.

Referring to FIGS. 2, 7, and 10, the operation S120 of FIG. 7 may include operation S122, and the operation S130 may include operations S132 and S134.

The computing system 20 may detect coordinates of each of the marks MX and MY (S110). The computing system 20 may acquire the value corresponding to the beam path changing factor for each of the marks MX and MY (S122). The processor 21 may acquire the value corresponding to the beam path changing factor for each first mark MX and the value corresponding to the beam path changing factor for each second mark MY.

The computing system 20 may acquire an offset for each mark by using the value corresponding to each beam path changing factor and the offset function (S132). The processor 21 may acquire an offset for each first mark MX and an offset for each second mark MY.

In the method of correcting coordinates of a mark according to some embodiments, the processor 21 may acquire an offset for each mark by using one offset function. The processor 21 may acquire an offset for each mark by using the same offset function. For example, the first mark MX may include a (1-1)th mark and a (1-2)th mark, which are different from each other, and the processor 21 may acquire an offset for the (1-1)th mark by using the offset function, and may acquire an offset for the (1-2)th mark by using the offset function.

In the method of correcting coordinates of a mark according to some embodiments, the processor 21 may acquire an offset for each mark by using a plurality of offset functions. The processor 21 may acquire an offset for each mark by using a different offset function for each mark. For example, the first mark MX may include a (1-1)th mark and a (1-2)th mark, which are different from each other, and the processor 21 may acquire the offset for the (1-1)th mark by using a first offset function, and may acquire the offset for the (1-2)th mark by using a second offset function. In this case, the first offset function may be different from the second offset function.

The computing system 20 may calculate an average value of the offset (S134). The processor 21 may calculate an average value of an offset for each first mark MX and an average value of an offset for each second mark MY.

The computing system 20 may correct the coordinates of the first mark MX by using the average value of the offset for each first mark MX, and may correct the coordinates of the second mark MY by using the average value of the offset for each second mark MY (S140).

For example, the first mark MX may include a (1-1)th mark and a (1-2)th mark, which are different from each other, and the second mark MY may include a (2-1)th mark and a (2-2)th mark, which are different from each other. The processor 21 may acquire a value corresponding to a beam path changing factor of the (1-1)th mark and a value corresponding to a beam path changing factor of the (1-2)th mark. The processor 21 may calculate the offset of the (1-1)th mark by using the value corresponding to the beam path changing factor of the (1-1)th mark and an offset function, and may calculate the offset of the (1-2)th mark by using the value corresponding to the beam path changing factor of the (1-2)th mark and an offset function. The processor 21 may calculate an average value of the offset of the (1-1)th mark and the offset of the (1-2)th mark. The processor 21 may correct the coordinates of the (1-1)th mark and the coordinates of the (1-2)th mark by using the average value of the offset. The processor 21 may acquire a value corresponding to the beam path changing factor of the (2-1)th mark and a value corresponding to the beam path changing factor of the (2-2)th mark. The processor 21 may calculate the offset of the (2-1)th mark by using the value corresponding to the beam path changing factor of the (2-1)th mark and the offset function, and may calculate the offset of the (2-2)th mark by using the value corresponding to the beam path changing factor of the (2-2)th mark and the offset function. The processor 21 may calculate an average value of the offset of the (2-1)th mark and the offset of the (2-2)th mark. The processor 21 may correct the coordinates of the (2-1)th mark and the coordinates of the (2-2)th mark by using the average value of the offset.

Figure 11:
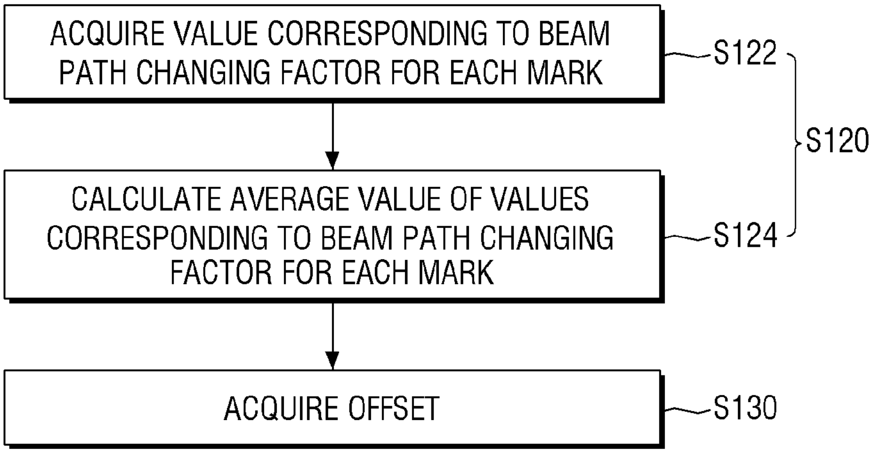
FIG. 11 is a flow chart illustrating a method of correcting coordinates of a mark according to some embodiments.

FIG. 11 is a flow chart illustrating a method of correcting coordinates of a mark according to some embodiments.

Referring to FIGS. 2, 7 and 11, the operation S120 of FIG. 7 may include operations S122 and S124.

The computing system 20 may acquire the value corresponding to the beam path changing factor for each of the marks MX and MY (S122). The processor 21 may acquire the value corresponding to the beam path changing factor for each first mark MX and the value corresponding to the beam path changing factor for each second mark MY.

The computing system 20 may calculate an average value of the values corresponding to the beam path changing factors for the respective marks MX and MY (S124). The processor 21 may calculate an average value of the values corresponding to the beam path changing factor for each first mark MX and an average value of the values corresponding to the beam path changing factor for each second mark MY.

The computing system 20 may acquire an offset by using the average value of the values corresponding to the beam path changing factors for the respective marks MX and MY and an offset function (S130). The processor 21 may calculate an offset by using the average value of the values corresponding to the beam path changing factor for each first mark MX, and may calculate an offset by using the average value of values corresponding to the beam path changing factor for each second mark MY.

For example, the first mark MX may include a (1-1)th mark and a (1-2)th mark, which are different from each other, and the second mark MY may include a (2-1)th mark and a (2-2)th mark, which are different from each other. The processor 21 may acquire a value corresponding to a beam path changing factor of the (1-1)th mark and a value corresponding to a beam path changing factor of the (1-2)th mark. The processor 21 may calculate an average value of the value corresponding to the beam path changing factor of the (1-1)th mark and the value corresponding to the beam path changing factor of the (1-2)th mark. The processor 21 may calculate an offset by using the average value and the offset function. The processor 21 may correct the coordinates of the (1-1)th mark and the coordinates of the (1-2)th mark by using the offset.

The processor 21 may acquire a value corresponding to a beam path changing factor of the (2-1)th mark and a value corresponding to a beam path changing factor of the (2-2)th mark. The processor 21 may calculate an average value of the value corresponding to the beam path changing factor of the (2-1)th mark and the value corresponding to the beam path changing factor of the (2-2)th mark. The processor 21 may calculate an offset by using the average value and the offset function. The processor 21 may correct the coordinates of the (2-1)th mark and the coordinates of the (2-2)th mark by using the offset.

Figure 12:
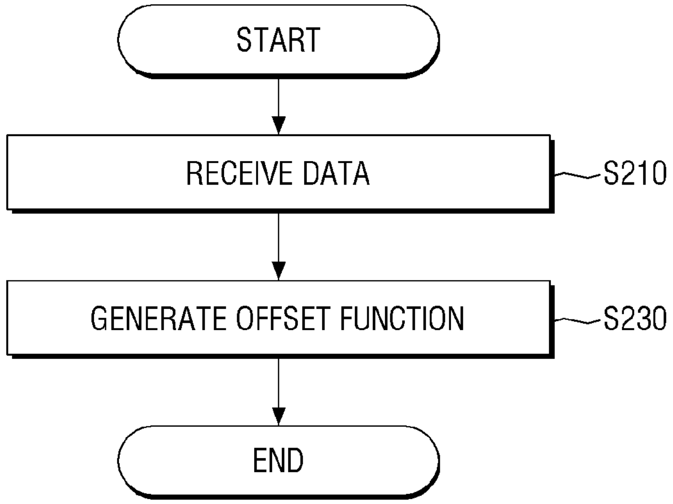
FIG. 12 is a flow chart illustrating a method of correcting coordinates of a mark according to some embodiments.

FIG. 12 is a flow chart illustrating a method of correcting coordinates of a mark according to some embodiments.

Referring to FIGS. 1 and 12, the computing system 20 may receive data (S210). The data may include a beam path changing factor and an offset of coordinates of the mark.

The computing system 20 may generate an offset function having a beam path changing factor as an input variable and the offset of the coordinates of the mark as an output variable (S230). The computing system 20 may generate one offset function. The computing system 20 may store the generated offset function. The computing system 20 may perform the operation S130 of FIGS. 7 and 9 by using the offset function.

Figure 13:
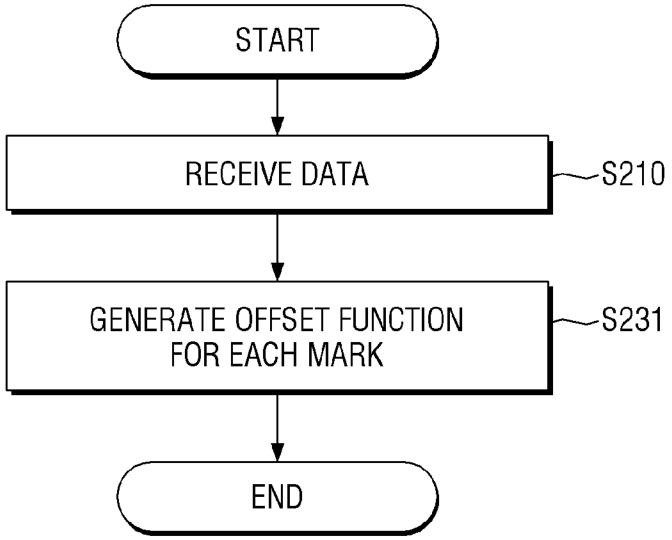
FIG. 13 is a flow chart illustrating a method of correcting coordinates of a mark according to some embodiments.

FIG. 13 is a flow chart illustrating a method of correcting coordinates of a mark according to some embodiments.

Referring to FIG. 13, the computing system 20 may generate an offset function for each mark (S230). The computing system 20 may generate an offset function for each mark(S231). For example, the first mark may include a (1-1)th mark and a (1-2)th mark, and the computing system 20 may generate an offset function for the (1-1)th mark and an offset function for the (1-2)th mark. The computing system 20 may store an offset function generated for each mark. The computing system 20 may perform the operation S130 of FIGS. 7 and 9 by using the offset function.

Figure 14:
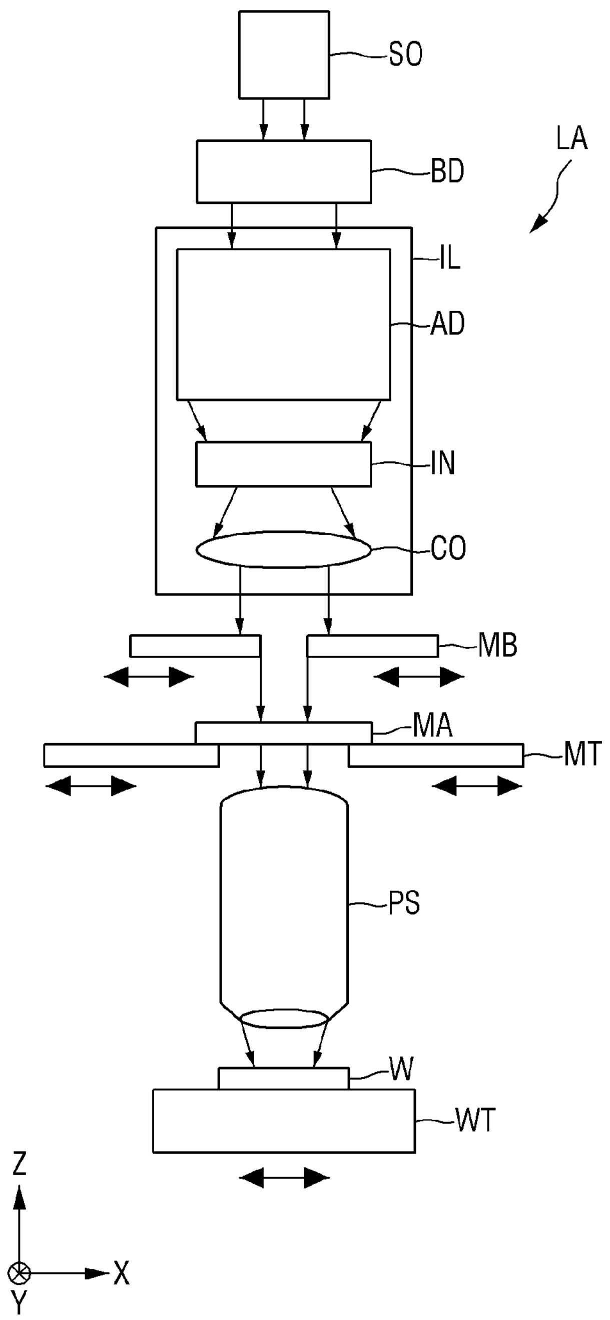
FIG. 14 is a view illustrating a lithography apparatus used for a photolithography method according to some embodiments.

FIG. 14 is a view illustrating a lithography apparatus according to some embodiments. For example, the lithography apparatus may perform a photolithography method according to some embodiments.

Referring to FIG. 14, a lithography apparatus LA may include hardware components, including a light source SO, a beam delivery system BD, an illuminator IL, a mask blinder MB, a mask table MT, a projection system PS, and a wafer table WT along a moving path of light.

The light source SO may emit ultraviolet light having a wavelength ranging from about 10 nm to about 400 nm, near ultraviolet light having a wavelength ranging from about 300 nm to about 400 nm, deep ultraviolet light having a wavelength ranging from about 200 nm to about 300 nm, or extreme ultraviolet light having a wavelength ranging from about 10 nm to about 200 nm. The light source SO may preferably emit deep ultraviolet light. In some embodiments in which the light source SO is an excimer laser, the light source SO may not be included as a portion of the lithography apparatus LA, and may be a separate element from the lithography apparatus LA. In some embodiments in which the light source SO is a mercury lamp, the light source SO may be included as a portion of the lithography apparatus LA.

The beam delivery system BD may transfer light from the light source SO to the illuminator IL. The beam delivery system BD may include a suitable directional mirror and/or beam expander. The illuminator IL may be configured to illuminate the mask MA by adjusting the light received from the light source SO with the aid of the beam delivery system BD. The illuminator IL may include various types of optical components for directing, shaping and/or controlling light, such as refractive, reflective, magnetic, electromagnetic, electrostatic or other types of optical components, or any combination thereof. The illuminator IL may include, for example, an adjuster AD for adjusting angular intensity distribution of light, a collimator IN, and a condenser CO. The illuminator IL may adjust light so that the light may have desired uniformity and intensity distribution.

The mask blinder MB may be configured to adjust an area of the mask MA illuminated by the lithography apparatus LA. In some embodiments, the mask blinder MB may include one or more motors or actuators. In some embodiments, the mask blinder MB may be positioned between the mask table MT and the illuminator IL, and a portion of the light emitted from the illuminator IL may reach the mask MA by passing through an opening of the mask blinder MB, whereas the remaining portion may be blocked by the mask blinder MB. A maximum area of the mask MA may be illuminated by the lithography apparatus LA when the opening of the mask blinder MB is opened to the maximum. By adjusting the size of the opening of the mask blinder MB, the area of the mask MA that is illuminated by the lithography apparatus LA may be adjusted within the maximum area.

The mask table MT may be configured such that the mask MA is mounted thereon. In some embodiments, the mask table MT may include one or more motors or actuators. The mask table MT may be configured to move the mask MA, and may be connected to a mask positioning device configured to accurately set the position of the mask MA in accordance with a specific parameter. The projection system PS may be configured to project light, which has passed through the mask MA, onto the wafer W. The projection system PS may include, for example, a refractive projection lens system. The wafer table WT may be configured so that the wafer W may be mounted thereon. The wafer table WT may be configured to move the wafer W, and may be connected to a wafer positioning device configured to accurately set the position of the wafer W in accordance with a specific parameter.

In some embodiments, a space between the projection system PS and the wafer W may be filled with a liquid, such as water, having a relatively high refractive index. An immersion liquid may be also another space of the lithography apparatus LA, such as a space between the mask and the projection system PS. The immersion technique may increase numerical apertures of the projection system PS.

The inspection apparatus 10 or the computing system 20 of FIG. 1 may be included in the lithography apparatus LA of FIG. 14, or may be a device separate from the lithography apparatus LA of FIG. 14.

Figure 15:
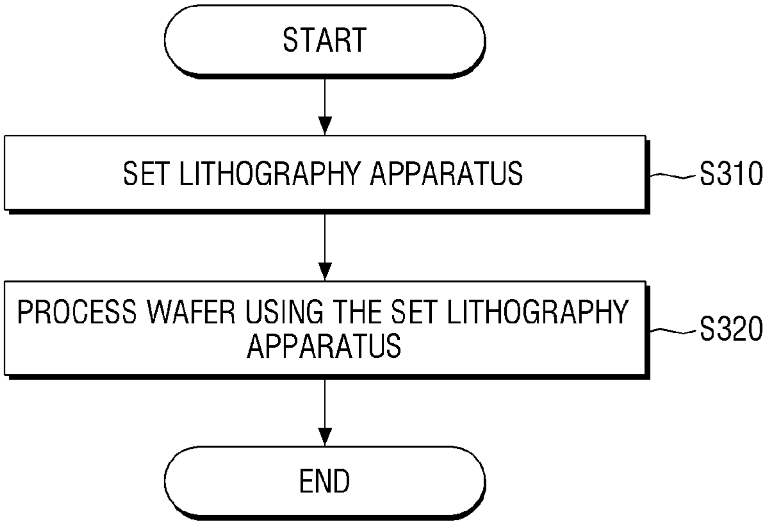
FIG. 15 is a flow chart illustrating a photolithography method according to some embodiments.

FIG. 15 is a flow chart illustrating a photolithography method according to some embodiments.

Referring to FIGS. 14 and 15, the lithography apparatus LA may be set (S310). Setting the lithography apparatus LA may include correcting the coordinates of the first and second marks MX and MY and receiving the corrected coordinates of the first and second marks MX and MY described with reference to FIGS. 1 to 13, and receiving the wafer W, in which the structure 30, the first mark MX, the second mark MY and the photoresist layer 40 are formed as described above with reference to FIGS. 5, 6 and 8. The computing system 20 may correct and store the coordinates of the mark described with reference to FIGS. 1 to 13, and the lithography apparatus LA may receive the corrected coordinates of the mark from the computing system 20.

Then, the wafer may be processed using the set lithography apparatus LA (S320). Processing the wafer using the set lithography apparatus LA may include exposing the wafer by using the corrected coordinates of the mark. In this case, as described with reference to FIGS. 5, 6 and 8, the wafer may be in a state that the structure 30, the first mark MX, the second mark MY and the photoresist layer 40 are formed. The lithography apparatus LA may expose the wafer in which the structure 30, the first mark MX, the second mark MY and the photoresist layer 40 are formed.

FIGS. 16 to 20 are views illustrating a method of correcting coordinates of a mark according to some embodiments. FIGS. 16 to 20 may correspond to the structure 30 of FIG. 5, 6 or 8.

Figure 16:
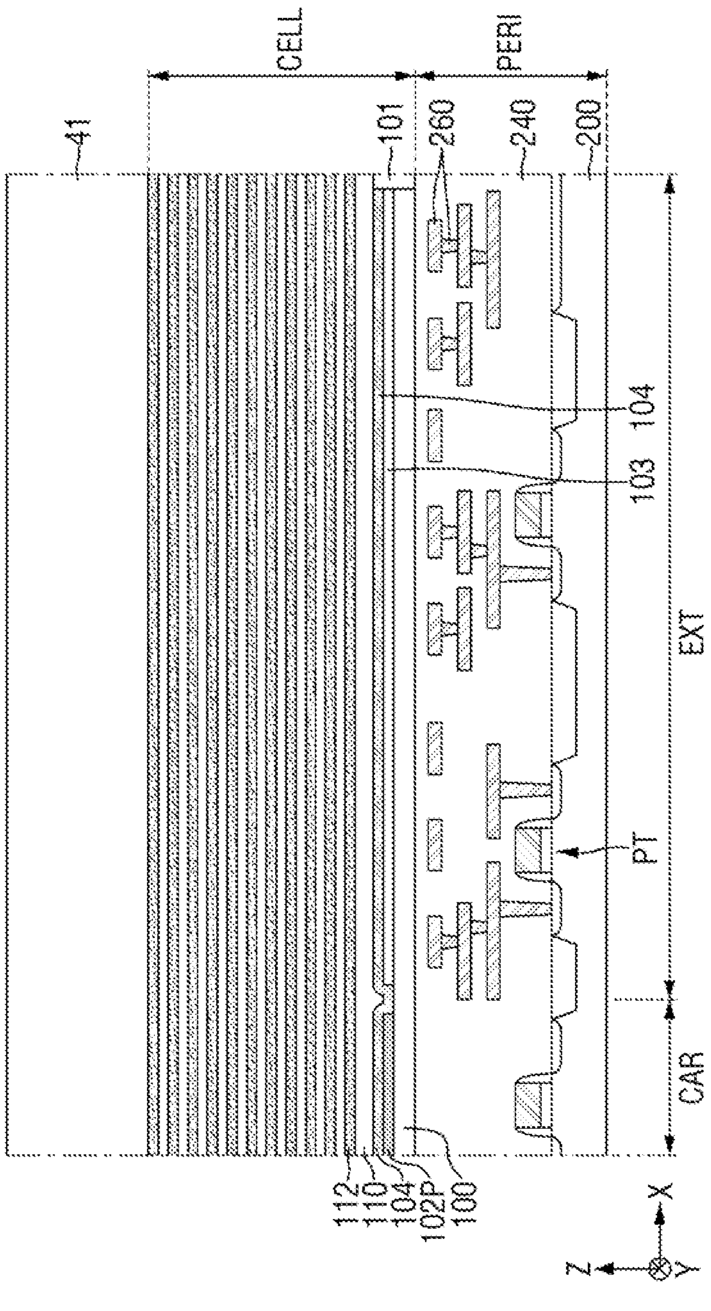
FIGS. 16 to 20 are views illustrating a method of correcting coordinates of a mark according to some embodiments.

Referring to FIG. 16, the structure may include, for example, mold sacrificial layers 112 and mold insulating layers 110, which are alternately stacked on a cell substrate 100 and an insulating substrate 101.

The mold sacrificial layers 112 may include a material having an etching selectivity with respect to the mold insulating layers 110. For example, the mold insulating layers 110 may include silicon oxide, and the mold sacrificial layers 112 may include silicon nitride.

In some embodiments, before the mold sacrificial layers 112 and the mold insulating layers 110 are stacked, a source sacrificial layer 102*p* and a second source layer 104 may be formed on the cell substrate 100 and the insulating substrate 101. The source sacrificial layer 102*p* may include a material having an etching selectivity with respect to the mold insulating layer 110. For example, the mold insulating layers 110 may include silicon oxide, and the source sacrificial layer 102*p* may include silicon nitride. The second source layer 104 may include polysilicon doped with impurities or polysilicon undoped with impurities, but is not limited thereto.

In some embodiments, the cell substrate 100 and the insulating substrate 101 may be stacked on a peripheral circuit area PERI. For example, a peripheral circuit element PT, a second wiring structure 260 and a second inter-wire insulating layer 240 may be formed on a peripheral circuit board 200. The cell substrate 100 and the insulating substrate 101 may be stacked on the second inter-wire insulating layer 240.

A first photoresist layer 41 may be formed on the structure. The first photoresist layer 41 may be formed on the mold sacrificial layers 112 and the mold insulating layers 110, which are alternately stacked.

Subsequently, the computing system 20 may correct the coordinates of the marks MX and MY in accordance with the method described with reference to FIGS. 1 to 13. The lithography apparatus LA may receive the corrected coordinates of the marks MX and MY from the computing system 20.

Figure 17:
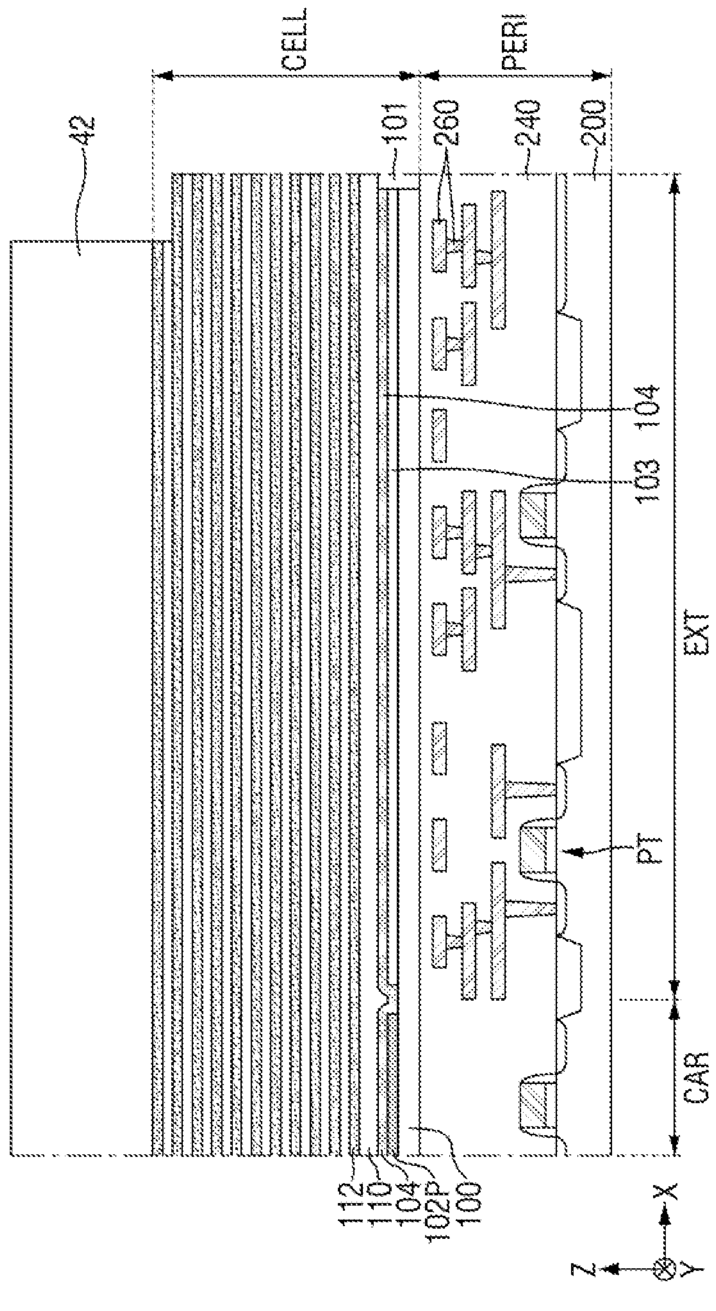

Referring to FIG. 17, the lithography apparatus LA may perform an exposure process for the first photoresist layer 41 by using the coordinates of the marks MX and MY. Therefore, a second photoresist layer 42 may be formed. The second photoresist layer 42 may partially expose an upper portion of the mold sacrificial layer 112.

The mold sacrificial layer 112 and the mold insulating layer 110 may be etched using the second photoresist layer 42 as an etching mask. For example, the mold sacrificial layer 112 of one layer and the mold insulating layer 110 of one layer may be etched. Therefore, a step difference may be formed at an end portion of the structure.

Subsequently, the computing system 20 may correct the coordinates of the marks MX and MY in accordance with the method described with reference to FIGS. 1 to 13. The computing system 20 may acquire an offset based on the structure of FIG. 15, and may correct the coordinates of the marks MX and MY. The lithography apparatus LA may receive the corrected coordinates of the marks MX and MY.

Figure 18:
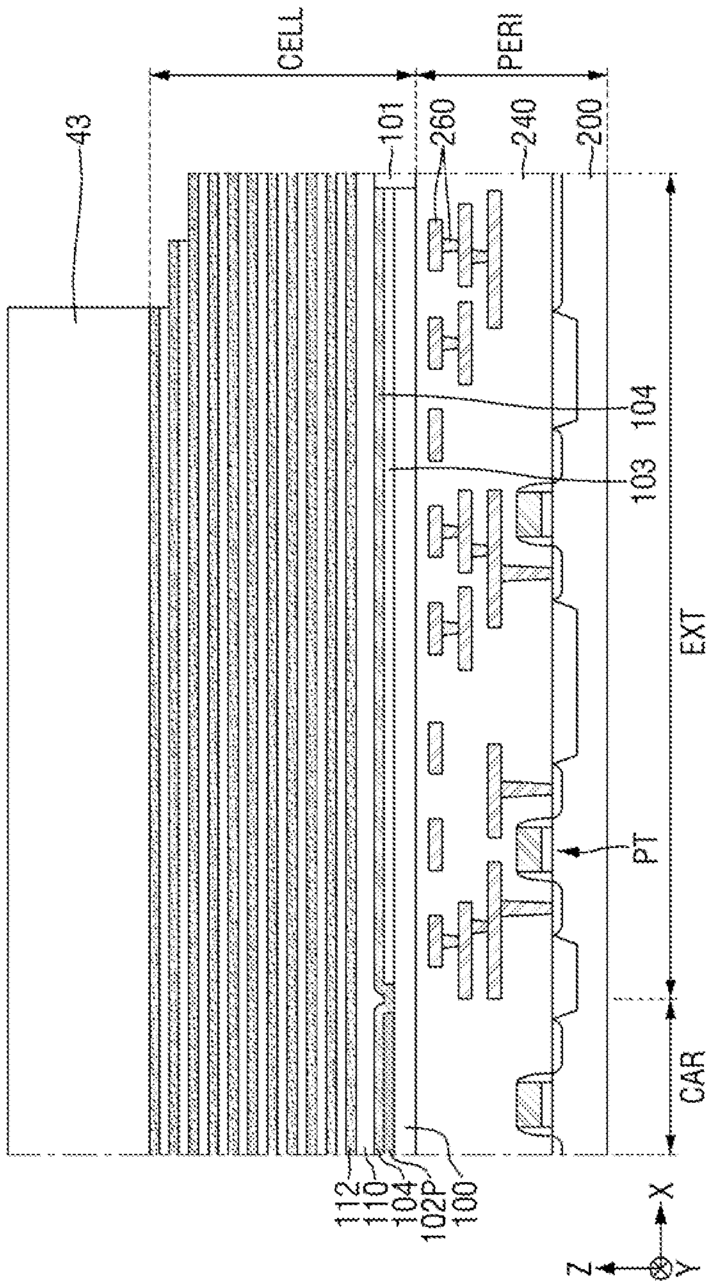

Referring to FIG. 18, the lithography apparatus LA may perform an exposure process for the second photoresist layer 42 by using the coordinates of the marks MX and MY. Therefore, a third photoresist layer 43 may be formed.

The mold sacrificial layer 112 and the mold insulating layer 110 may be etched using the third photoresist layer 43 as an etching mask. For example, the mold sacrificial layer 112 of one layer and the mold insulating layer 110 of one layer may be etched. Therefore, a step difference may be formed at an end portion of the structure.

Subsequently, the computing system 20 may correct the coordinates of the marks MX and MY in accordance with the method described with reference to FIGS. 1 to 13. The computing system 20 may acquire an offset based on the structure of FIG. 16, and correct the coordinates of the marks MX and MY. The lithography apparatus LA may receive the corrected coordinates of the marks MX and MY.

The coordinates of the marks MX and MY may be corrected, an exposure process may be performed for the photoresist layer using the corrected coordinates of the marks, and the mold sacrificial layer 112 and the mold insulating layer 110 may be repeatedly etched using the exposed photoresist layer, whereby a portion having a stair shape may be formed in the structure.

Figure 19:
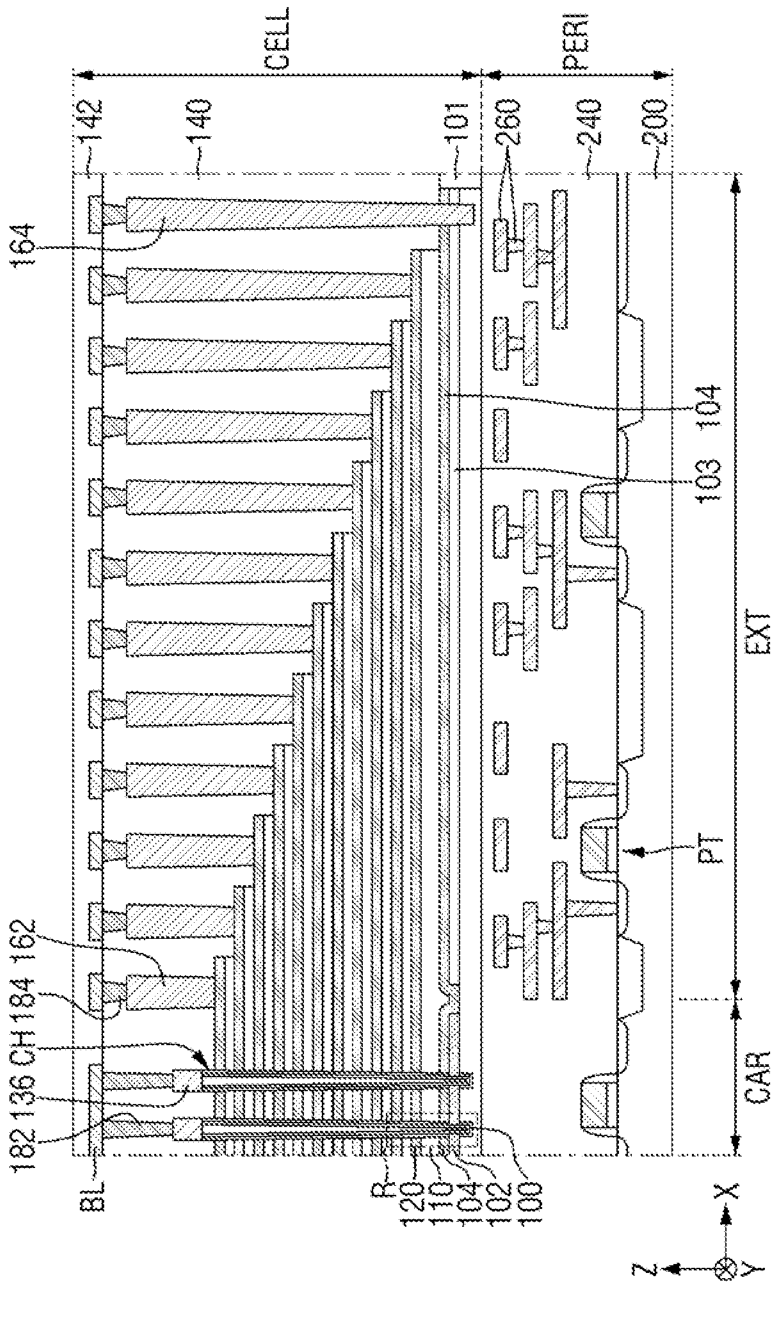
Figure 20:
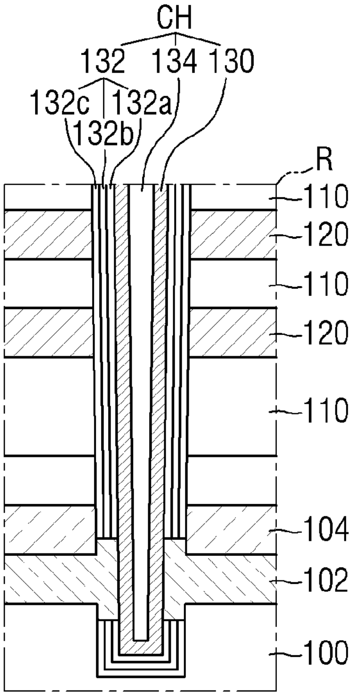

Referring to FIGS. 19 and 20, a first interlayer insulating layer 140 may be formed to cover the structure. The first interlayer insulating layer 140 may cover the portion having a stair shape.

A channel structure CH extended in the third direction Z to pass through the mold insulating layer 110 and the mold sacrificial layer 112 may be formed. The channel structure CH may include a semiconductor pattern 130 and an information storage layer 132. FIG. 20 is a detailed portion of the region R in FIG. 19.

The semiconductor pattern 130 may extend in the third direction Z to pass through the mold insulating layer 110 and the mold sacrificial layer 112. Although the semiconductor pattern 130 is shown as having a cup shape, this is only exemplary. For example, the semiconductor pattern 130 may have various shapes such as a cylindrical shape, a quadrangular cylindrical shape, and a filled pillar shape.

In some embodiments, the information storage layer 132 may be formed of multiple layers. For example, the information storage layer 132 may include a channel insulating layer 132*a*, a charge storage layer 132*b* and a blocking insulating layer 132*c*, which are sequentially stacked on an outer surface of the semiconductor pattern 130.

The channel insulating layer 132*a* may include, for example, silicon oxide or a high dielectric constant material (e.g., aluminum oxide ($Al_2O_3$) or hafnium oxide ($HfO_2$)) having a dielectric constant higher than that of silicon oxide. The charge storage layer 132*b* may include, for example, silicon nitride. The blocking insulating layer 132*c* may include, for example, silicon oxide or a high dielectric constant material (e.g., aluminum oxide ($Al_2O_3$) or hafnium oxide ($HfO_2$)) having a dielectric constant higher than that of silicon oxide.

The channel structure CH may further include a channel pad 136. The channel pad 136 may be formed to be connected to an upper portion of the semiconductor pattern 130. The channel pad 136 may include, for example, polysilicon doped with impurities, but is not limited thereto.

The mold sacrificial layer 112 and the source sacrificial layer 102*p* may be removed using a word line cutting area. A gate electrode 120 may be formed in an area from which the mold sacrificial layer 112 is removed. A source layer 102 may be formed in an area from which the source sacrificial layer 102*p* is removed. The source layer 102 may be connected to the semiconductor pattern 130 of the channel structure CH.

A cell contact 162 connected to the gate electrode 120 and a source contact 164 connected to the source layer 102 may be formed. A second interlayer insulating layer 142 may be formed on the first interlayer insulating layer 140. The bit line BL may be formed in the second interlayer insulating layer 142. A bit line BL may be connected to the cell contact 162 and the source contact 164 through a contact via 184.

While aspects of embodiments have been particularly shown and described, it will be understood that various changes in form and details may be made therein without departing from the spirit and scope of the following claims.

What is claimed is:

1. A method of detecting coordinates of a mark, the method comprising:

providing a plurality of structures and the mark on a wafer, each of the plurality of structures comprising a plurality of mold insulating layers and a plurality of mold sacrificial layers, which are alternately stacked, an end of each of the plurality of structures comprising a portion having a stair shape, and the mark being between adjacent structures among the plurality of structures;

forming a photoresist layer on the plurality of structures and the mark, the photoresist layer comprising a portion concave toward the wafer between the adjacent structures;

detecting the coordinates of the mark by irradiating a beam to the mark;

determining an offset of the coordinates of the mark based on a beam path changing factor; and correcting the coordinates of the mark based on the offset.

2. The method of claim 1, wherein the beam path changing factor comprises a height of a structure adjacent to the mark, a height of the photoresist layer, a horizontal distance between the structure adjacent to the mark and the mark, a horizontal distance between an inflection point of the photoresist layer and the mark, and a slope of an upper surface of the photoresist layer at a point vertically overlapping the mark.

3. The method of claim 2, wherein the beam path changing factor further comprises a refractive index and a dielectric constant of the photoresist layer.

4. The method of claim 2, wherein the beam path changing factor further comprises a wavelength of the beam.

5. The method of claim 1, wherein the mark comprises:

a first mark disposed between structures, among the plurality of structures, which are adjacent to each other in a first direction; and a second mark disposed between structures, among the plurality of structures, which are adjacent to each other, in a second direction perpendicular to the first direction, wherein the determining the offset of the coordinates of the mark comprises determining a first offset of coordinates of the first mark and a second offset of coordinates of the second mark, and wherein the correcting the coordinates of the mark comprises correcting the coordinates of the first mark based on the first offset, and correcting the coordinates of the second mark based on the second offset.

6. The method of claim 5, wherein the first offset is an offset of the coordinates of the first mark in the first direction, and wherein the second offset is an offset of the coordinates of the second mark in the second direction.

7. The method of claim 5, wherein the first mark comprises a (1-1)th mark and a (1-2)th mark, and the second mark comprises a (2-1)th mark and a (2-2)th mark, wherein the determining the offset of the coordinates of the mark comprises determining a (1-1)th offset of coordinates of the (1-1)th mark, a (1-2)th offset of coordinates of the (1-2)th mark, a (2-1)th offset of coordinates of the (2-1)th mark, and a 2-2 offset of coordinates of the (2-2)th mark, and wherein the correcting the coordinates of the mark comprises correcting the coordinates of the (1-1)th mark and the coordinates of the (1-2)th mark based on an average value of the (1-1)th offset and the (1-2)th offset, and correcting the coordinates of the (2-1)th mark and the coordinates of the (2-2)th mark based on an average value of the (2-1)th offset and the (2-2)th offset.

8. The method of claim 5, wherein the first mark comprises a (1-1)th mark and a (1-2)th mark, and the second mark comprises a (2-1)th mark and a (2-2)th mark, and wherein the determining the offset of the coordinates of the mark comprises determining the first offset determined based on an average value of a value corresponding to the beam path changing factor of the (1-1)th mark and a value corresponding to the beam path changing factor of the (1-2)th mark, and determining the second offset determined based on an average value of a value corresponding to the beam path changing factor of the (2-1)th mark and a value corresponding to the beam path changing factor of the (2-2)th mark.

9. The method of claim 5, wherein the first mark comprises a (1-1)th mark and a (1-2)th mark, and the second mark comprises a (2-1)th mark and a (2-2)th mark, wherein the determining the offset of the coordinates of the mark comprises determining a (1-1)th offset of coordinates of the (1-1)th mark, a (1-2)th offset of coordinates of the (1-2)th mark, a (2-1)th offset of coordinates of the (2-1)th mark, and a (2-2)th offset of coordinates of the (2-2)th mark, and wherein the correcting the coordinates of the mark comprises:

correcting the coordinates of the (1-1)th mark based on the (1-1)th offset;

correcting the coordinates of the (1-2)th mark based on the (1-2)th offset;

correcting the coordinates of the (2-1)th mark based on the (2-1)th offset; and correcting the coordinates of the (2-2)th mark based on the (2-2)th offset.

10. A method of detecting coordinates of a mark, the method comprising:

providing a plurality of structures and a mark on a wafer;

forming a photoresist layer on the plurality of structures and the mark, an upper surface of the photoresist layer comprising an inflection point between adjacent structures among the plurality of structures;

determining the coordinates of the mark by irradiating a beam to the mark;

determining an offset of the coordinates of the mark based on a beam path changing factor; and correcting the coordinates of the mark based on the offset.

11. The method of claim 10, wherein the beam path changing factor comprises a height of a structure adjacent to the mark, a height of the photoresist layer, a horizontal distance between the structure adjacent to the mark and the mark, a horizontal distance between the inflection point of the photoresist layer and the mark, and a slope of the upper surface of the photoresist layer at a point vertically overlapping the mark.

12. The method of claim 11, wherein the beam path changing factor further comprises a refractive index and a dielectric constant of the photoresist layer.

13. The method of claim 11, wherein the beam path changing factor further comprises a wavelength of the beam.

14. The method of claim 10, wherein the mark is disposed between structures, among the plurality of structures, which are adjacent to each other, wherein the determining the offset of the coordinates of the mark comprises determining a first offset of the coordinates of the mark in a first direction, and wherein the correcting the coordinates of the mark comprises correcting the coordinates of the mark in the first direction based on the first offset.

15. The method of claim 10, further comprising:

detecting a signal of diffractive light by irradiating the beam to the mark while moving a light source in a direction parallel with an upper surface of the wafer; and generating an offset function of the coordinates of the mark based on the signal of the diffractive light and the beam path changing factor, wherein the determining the offset of the coordinates of the mark comprises using the offset function of the coordinates of the mark.

16. The method of claim 10, wherein the mark comprises a plurality of marks disposed at different positions on the wafer, and wherein the correcting the coordinates of the mark further comprises:

correcting the coordinates of each of the plurality of marks;

acquiring a signal of diffractive light by irradiating the beam to the corrected coordinates of each mark; and correcting the corrected coordinates of each of the plurality of marks based on a second set value based on a number of marks, in which intensity of the signal of the diffractive light is greater than or equal to a threshold value, being greater than or equal to a first set value.

* * * * *